(12) United States Patent
Qin et al.

(10) Patent No.: US 11,251,106 B2
(45) Date of Patent: Feb. 15, 2022

(54) PACKAGING STRUCTURE OF A SIC MOSFET POWER MODULE AND MANUFACTURING METHOD THEREOF

(71) Applicant: BEIJING UNIVERSITY OF TECHNOLOGY, Beijing (CN)

(72) Inventors: Fei Qin, Beijing (CN); Shuai Zhao, Beijing (CN); Yanwei Dai, Beijing (CN); Pei Chen, Beijing (CN); Tong An, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 17/219,788

(22) Filed: Mar. 31, 2021

(65) Prior Publication Data

US 2021/0217681 A1 Jul. 15, 2021

Related U.S. Application Data

(63) Continuation of application No. PCT/CN2019/124448, filed on Dec. 11, 2019.

(30) Foreign Application Priority Data

Nov. 9, 2019 (CN) .......................... 201911090620.8

(51) Int. Cl.
*H01L 23/373* (2006.01)
*H01L 23/15* (2006.01)
(Continued)

(52) U.S. Cl.
CPC .......... *H01L 23/3735* (2013.01); *H01L 23/15* (2013.01); *H01L 23/49844* (2013.01);
(Continued)

(58) Field of Classification Search
CPC ................. H01L 23/3735; H01L 23/15; H01L 23/49844; H01L 23/5384;
(Continued)

(56) References Cited

U.S. PATENT DOCUMENTS 9,704,819 B1* 7/2017 Gao ....................... H01L 24/92
2008/0054425 A1 3/2008 Malhan
(Continued)

FOREIGN PATENT DOCUMENTS

CN WO2013005474 A1 2/2015
CN 104900609 9/2015
(Continued)

OTHER PUBLICATIONS

International Search Report.
(Continued)

*Primary Examiner* — Fernando L Toledo
*Assistant Examiner* — Neil R Prasad
(74) *Attorney, Agent, or Firm* — J.C. Patents

(57) ABSTRACT

The invention discloses a packaging structure and manufacturing method of a SiC MOSFET module, which is composed of SiC MOSFET chips, upper DBC substrate, lower DBC substrate, ceramic interposer, silicon oxide dielectric layer, nano silver pastes, redistribution layer, through-ceramic-hole conductive metals and power terminals. The SiC MOSFET chips are connected to the lower DBC substrate using nano silver pastes in the invention. Besides, some rectangular frames are made on the ceramic interposer, and the SiC MOSFET chips are embedded in the ceramic interposer by filling dielectric materials. The upper surfaces of the chips and the ceramic interposer are covered with a conductive metal redistribution layer, and the upper and lower surfaces of the ceramic interposer are interconnected with the upper and lower DBC substrates, respectively. The
(Continued)

power terminals are led out from the conductive copper layers of the upper and lower DBC substrates. This invention can realize the high-temperature packaging of SiC MOSFET modules. By introducing double-sided heat dissipation, the thermal performance can be improved effectively. The parasitic inductance of the module can be also reduced by using planar interconnection instead of wire bonding.

4 Claims, 4 Drawing Sheets

(51) Int. Cl.
    *H01L 23/498* (2006.01)
    *H01L 23/538* (2006.01)
    *H01L 23/00* (2006.01)
    *H01L 29/16* (2006.01)

(52) U.S. Cl.
    CPC ...... *H01L 23/5384* (2013.01); *H01L 23/5389* (2013.01); *H01L 24/19* (2013.01); *H01L 24/24* (2013.01); *H01L 24/27* (2013.01); *H01L 24/32* (2013.01); *H01L 29/1608* (2013.01); *H01L 2224/24245* (2013.01); *H01L 2224/2732* (2013.01); *H01L 2224/32245* (2013.01); *H01L 2924/01047* (2013.01); *H01L 2924/30107* (2013.01)

(58) Field of Classification Search
    CPC . H01L 1123/5389; H01L 24/19; H01L 24/24; H01L 24/27; H01L 24/32; H01L 29/1608; H01L 2224/24245; H01L 2224/2732; H01L 2224/32245; H01L 2924/01047; H01L 2924/30107

See application file for complete search history.

(56) References Cited

U.S. PATENT DOCUMENTS

| 2013/0020694 | A1  | 1/2013 | Liang |      |
|---|---|---|---|---|
| 2015/0115452 | A1* | 4/2015 | Yoon ........................ | H01L 24/83 |
|  |  |  |  | 257/762 |
| 2019/0122970 | A1* | 4/2019 | Teysseyre ............... | H01L 24/29 |

FOREIGN PATENT DOCUMENTS

| CN | 105453256 A | 3/2016 |
| CN | 105914185 A | 8/2016 |
| CN | 106876350 A | 6/2017 |
| CN | 107195623 A | 9/2017 |
| CN | 107910324 A | 4/2018 |

OTHER PUBLICATIONS

First Office Action of the priority CN Application No. 201911090620.8.
Search Report of the priority CN Application No. 201911090620.8.
Notice to Grant Patent for the priority CN Application No. 201911090620.8.

* cited by examiner

PACKAGING STRUCTURE OF A SIC MOSFET POWER MODULE AND MANUFACTURING METHOD THEREOF

CROSS-REFERENCE TO RELATED APPLICATIONS

This application is a continuation of International Application No. PCT/CN2019/124448, filed on Dec. 11, 2019, which claims priority to Chinese Patent Application No. 201911090620.8, filed on Nov. 9, 2019. The contents of the above applications are hereby incorporated by reference in their entireties and form a part of this specification.

FIELD OF THE INVENTION

The invention relates to the packaging technology field of power electronic devices, and more particularly, a packaging structure of a SiC power module and manufacturing method thereof.

BACKGROUND TECHNOLOGY

The development of power electronics technology is always towards higher efficiency, higher power density and higher integration. Nowadays, compared with traditional silicon-based power semiconductor devices, wide bandgap power semiconductor power devices have smaller volume, lower conduction loss, higher breakdown voltage, higher thermal conductivity and higher working temperature. Therefore, wide bandgap power semiconductor devices are suitable for high-voltage, high-temperature and high-frequency application scenarios, which is in line with the development trend of power electronics technology. It can be said that the pace of development of power electronic technology is determined by wide bandgap power semiconductor devices. At present, SiC MOSFET devices have great application potential in new energy vehicles, photovoltaic power generation, rail transit, aerospace et al fields. In 2018, Tesla firstly successfully applied 650V SiC MOSFET module to its Model 3 motorcycle type, which is one of the most dramatic news in the field of power semiconductor and SiC in 2018.

Although SiC MOSFET devices have many advantages over traditional silicon-based power devices, the packaging technology of SiC power modules has become the bottleneck technology limiting the application of SiC power devices. The main reasons are as follows. First of all, SiC power module has high power density and high working temperature. SiC power devices can work at ambient temperature above 500° C. Besides, the SiC power module has smaller volume and higher integration. However, the traditional silicon-based power module is mostly single-sided heat dissipation, and heat can only be transferred from the collector of the power chip, so the heat dissipation efficiency is very low. Heat dissipation under high temperature condition is one of the key problems in SiC power module packaging. Secondly, the highest working frequency of the SiC power module is more than ten times that of silicon-based power module. Even if the parasitic inductance is very low, the module will produce large stray signal and electromagnetic interference under high frequency working conditions. However, the traditional silicon-based power modules are usually interconnected by wire bonding, which has high parasitic inductance, so it is not suitable for high-frequency working environment. In addition, macromolecule polymer materials like silicone gels or epoxy polymers et al are often used as electrical insulation in traditional silicon-based power modules, however, the highest endurable temperature of macromolecule materials is generally at 200~300 degrees. How to solve the insulation problem of the modules is also one of the key issues that enterprises and researchers concerning.

The Chinese patent 201810616670.4 discloses a SiC MOSFET power module with a new packaging structure. The power module includes: a first DC side terminal, a second DC side terminal, an AC side terminal, a first drive terminal, a second drive terminal, a first SiC metal oxide semiconductor field-effect transistor, a second SiC metal oxide semiconductor field-effect transistor, a diode and a base; a first DC side terminal, a second DC side terminal, an AC side terminal, a first drive terminal and a second drive terminal are set on the upper surface of the base; the first DC side terminal and the second DC side terminal are located on the same axis. The DC side terminal with coaxial structure can effectively reduce the distance between DC side terminals and increase their coupling area, increase the mutual induction of DC side terminals, reduce the packaging inductance of power module, further reduce the voltage overshoot sustained by SiC MOSFET in the power module under switching transient and short circuit conditions, and reduce the switching loss of power module.

The China Patent 201710954332.7 discloses a module and a packaging method based on nano silver paste double-sided interconnecting with SiC MOS device; and comprises a power terminal, an upper DBC substrate, a lower DBC substrate, a nano silver paste, a buffer layer and n pairs of SiC FRED chips and SiC MOS chips, a grid resistance, a coarse aluminum wire, a silicone gel and a moulding resin. The lower surface of the SiC MOS chip, the lower surface of SiC Fred chip, and the lower surface of the buffer layer are parallel connected on the lower DBC substrate in parallel; so does the upper DBC substrate; the upper surface of the SiC MOS chip, the upper surface of the SiC Fred chip and the upper surface of the buffer layer of the upper DBC substrate are interconnected, and similarly, the buffer layer of the lower DBC substrate is interconnected to the SiC MOS chip and the SiC Fred chip of the upper DBC substrate. Nano silver solder paste is used to connect power chip and buffer layer to DBC substrate, which has the advantages of low sintering temperature, high melting point and high thermal conductivity.

Although all the above-mentioned inventions have realized the good application of SiC power module at higher frequency to a certain extent, they have not fully exerted the advantages of SiC power devices compared with silicon-based power devices in high-temperature applications. How to realize the high-temperature packaging of SiC power modules is of great significance for giving full play to the advantages of SiC power devices and ensuring the high-temperature applications of power devices under extremely severe conditions.

SUMMARY OF THE INVENTION

In order to realize the application of the SiC power module in high temperature and high frequency working environment, the invention provides a packaging structure and manufacturing method of SiC power module which can withstand high temperature of 300° C. Taking the SiC MOSFET chip embedded with Schottky Barrier Diodes (SBD) as an example, the SiC MOSFET chip is embedded in the ceramic interposer, and the ceramic interposer is bonded with the upper and lower DBC substrates at high temperature to realize electrical interconnection. The bottom surface of the MOSFET chip is welded to the lower DBC substrate using high temperature resistant nano silver solder paste. The ceramic interposer can realize good electrical insulation and can withstand extremely high temperature. Nano silver solder paste has high melting point (960° C.) and good thermal conductivity (240 W·M$^{-1}$·k$^{-1}$). At the same time, the dual DBC substrates can be both connected to the radiators to realize the double-sided heat dissipation of the module, therefore, the module can realize the application of SiC power module in the high-temperature working environment above 300° C.

The technical scheme of the invention is realized as follows:

A packaging structure of SiC MOSFET module,

It consists of SiC MOSFET chips embedded with SBD, ceramic interposer, nano silver pastes, upper DBC substrate, lower DBC substrate, silicon oxide dielectric layer, redistribution layer, through-ceramic-hole conductive metal, positive terminal, negative terminal, gate terminal and common terminal. The source electrode and gate electrode on the front side of the said SiC MOSFET chip and the drain electrode on the back side of the said SiC MOSFET. The drain electrode of the said SiC MOSFET chip is connected to the upper copper layer of the said lower DBC substrate by the said nano silver paste, the said ceramic interposer is also connected to the upper copper layer of the said lower DBC substrate, and the upper copper layer of the said lower DBC substrate is connected to the positive terminal of the module. The said ceramic interposer contains some rectangular frames and a cylindrical holes, and the said SiC MOSFET chips are embedded in the said rectangular frame. The redistribution layer and the silicon oxide dielectric layer are set on the upper surfaces of the said SiC MOSFET chips and the said ceramic interposer, the said redistribution layer and the said silicon oxide dielectric layer are connected to the lower copper layer of the upper DBC substrate, and the said redistribution layer is connected to the gate electrode, negative terminal and common terminal of the said SiC MOSFET module.

As a further improvement of the invention, the packaging structure of the said SiC MOSFET module is characterized in that there is a gap between the said SiC MOSFET chip and the said frame. The said gap is provided with a silicon oxide dielectric layer, and the said cylindrical hole is filled with conductive metals.

A manufacturing method of SiC MOSFET module includes the following steps:

Step 1, a ceramic interposer is provided, and some rectangular frames and cylindrical holes are made on the ceramic adapter plate by laser cutting technology.

Step 2, conductive metals are filled into the cylindrical holes of the said ceramic interposer.

Step 3, a lower DBC substrate is provided, and the nano silver pastes are printed on the copper layer on the upper side of the lower DBC substrate by means of steel screen printing, and the SiC MOSFET chips are mounted on the surface of the nano silver pastes.

Step 4, the positive terminal of the module is welded to the upper copper layer of the said lower DBC substrate.

Step 5, the said ceramic interposer is bonded to the copper layer on the upper side of the said lower DBC substrate, and each SiC MOSFET chip is embedded in the corresponding rectangular frame on the said ceramic interposer, and a gap is kept between each chip and each frame.

Step 6, a silicon oxide dielectric layer is made in the said gap, and the upper surfaces of the said SiC MOSFET chips and the ceramic interposer.

Step 7, a redistribution layer is made on the upper surface of the said SiC MOSFET chips and the said ceramic interposer, and the said redistribution layer is embedded in the said silicon oxide dielectric layer.

Step 8, a gate terminal, a negative terminal and a common terminal of the module are welded to the upper surface of the said redistribution layer.

Step 9, the upper surface of the said redistribution layer is connected to the lower copper layer of the upper DBC substrate.

As a further improvement of the invention, the manufacturing method of the said SiC MOSFET module is characterized in that a plurality of SiC MOSFET chips are paralleled between the upper and lower DBC substrates on each bridge arm, and the upper and lower bridge arms are connected in series to realize the packaging of double-sided interconnection half bridge SiC power modules at different power levels.

The invention has the following advantages:

(1) The invention realizes high-temperature packaging of SiC MOSFET chip embedded with Schottky barrier diode (SBD), and polymers and lead-free solders which cannot withstand high temperature are not used in the packaging structure, and the module can sustain high-temperature working environment above 300° C.

(2) The SiC MOSFET chips are embedded into the ceramic interposer in the invention, and the thermal expansion coefficient of the ceramic interposer is similar to that of the SiC MOSFET chip, and smaller thermal stress is induced by thermal mismatch in high-temperature environment. Because the main body of the upper and lower DBC substrate is also ceramic material, smaller interface stress caused by thermal mismatch between the ceramic interposer and the upper and lower DBC substrate.

(3) Compared with single-sided heat dissipation, double-sided heat dissipation can improve the thermal performance of the module effectively, which could further improve the high temperature resistance of the module.

In combination with the appended drawings, the illustration is as follows:

1-SiC MOSFET chip
101-SiC MOSFET chip source electrode
102-SiC MOSFET chip gate electrode
103-SiC MOSFET chip drain electrode
  2-upper DBC substrate
201-lower copper layer of the upper DBC substrate
  3-lower DBC substrate
301-upper copper layer of the lower DBC substrate
  4-ceramic interposer
401-rectangular frame
402-cylindrical hole
403-gap
    5-silicon oxide dielectric layer
    6-nano silver paste
    7-redistribution layer
    8-through-ceramic-hole conductive metal
    9-power terminal
    9A-positive terminal
    9b-gate terminal
    9C-common terminal
    9d-negative terminal

EXEMPLARY EMBODIMENT

In order to make the invention more obvious and easy to be understood, the exemplary embodiment of the invention is described in detail in combination with the appended drawings. For convenience of illustration, the components of the structures in the appended drawings of the embodiment are not scaled according to the normal scale and thus do not represent the actual relative sizes of the structures in the embodiment.

Figure 1:
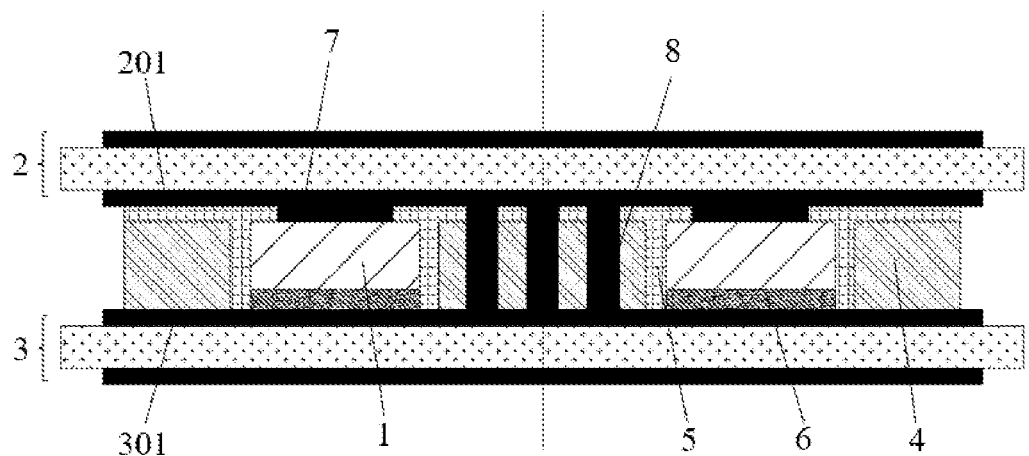
FIG. 1 is a schematic diagram of the packaging structure of a SiC MOSFET module drawn according to an embodiment of the present invention.
Figure 2:
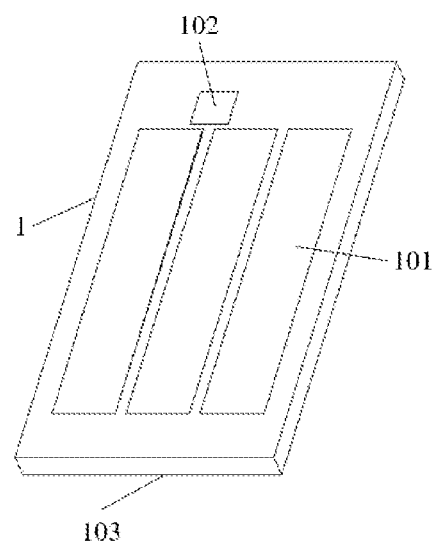
FIG. 2 is the schematic diagram of the structure of SiC MOSFET chip.

As shown in FIG. 1, the invention discloses the structure of a SiC MOSFET module packaging, which consists of SiC MOSFET chips embedded with SBD (1), upper DBC substrate (2), lower DBC substrate (3), ceramic interposer (4), silicon oxide dielectric layer (5), nano silver paste (6), redistribution layer (7), through-ceramic-hole conductive metal (8), positive terminal (9a), negative terminal (9D) and gate terminal (9b) and a common terminal (9C). The source electrode (101) and gate electrode (102) are on the front side of the said SiC MOSFET chip (1), and the drain electrode (103) is on the back side of the SiC MOSFET chip. The drain electrode (103) of the said SiC MOSFET chip (1) is connected to the upper copper layer (301) of the said lower DBC substrate by the said nano silver solder paste (6), and the said ceramic interposer (4) is also connected to the upper copper layer (301) of the said lower DBC substrate, the upper copper layer (301) of the said lower DBC substrate is connected to a positive terminal (9a) of the module. The said ceramic interposer (4) is provided with some rectangular frames (401) and cylindrical holes (402), and the said SiC MOSFET chips (1) are embedded in the said rectangular frames (401). The redistribution layer (7) and the silicon oxide dielectric layer (5) are set on the upper surface of the said SiC MOSFET chip (1) and the upper surface of the said ceramic interposer (4), the said redistribution layer (7) and the said silicon oxide dielectric layer (5) are connected to the lower copper layer (201) of the upper DBC substrate, and the said redistribution layer (7) is connected to the gate electrode, common terminal (9c) and negative terminal (9d) of the said SiC MOSFET module (9b).

Preferably, a gap (403) exists between the said SiC MOSFET chip (1) and the said frame (401). The said gap (403) is filled with a silicon oxide dielectric layer (5), and the said cylindrical holes (402) are filled with the conductive metals (8).

The manufacturing method of the SiC MOSFET module is introduced as follows in combination with FIGS. 3-9.

Figure 3:
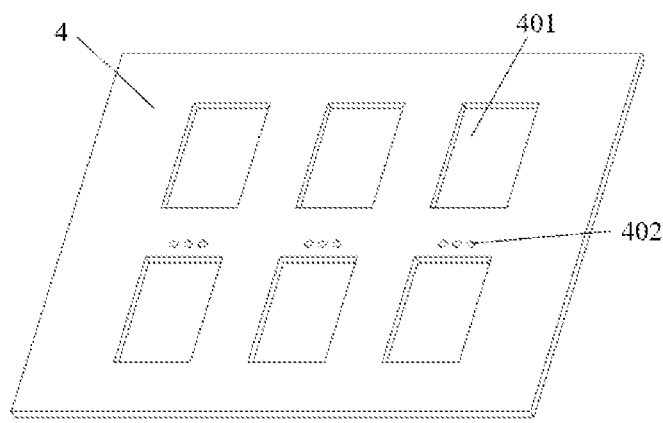
FIG. 3 is the schematic diagram of the packaging structure after step 1.

Step 1, as shown in FIG. 3, a ceramic interposer (4) is provided, and rectangular frames (401) and cylindrical holes (402) are made on the ceramic adapter plate.

Step 2, conductive metals (9) are filled into the cylindrical holes (402) of the said ceramic interposer (4).

Figure 4:
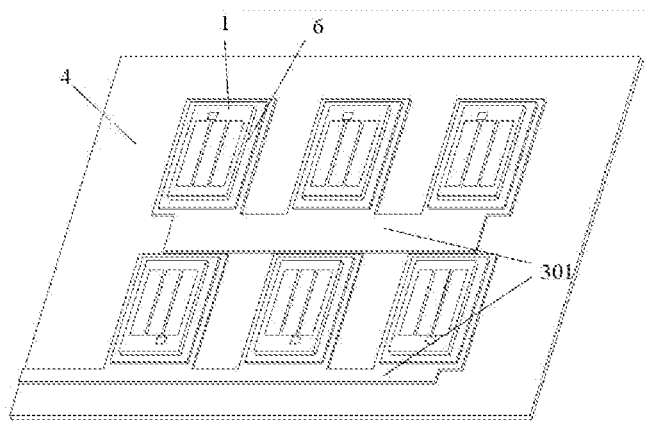
FIG. 4 is the schematic diagram of the packaging structure after step 3.

Step 3, as shown in FIG. 4, a lower DBC substrate (3) is provided, and the nano silver pastes (6) are printed on the copper layer (301) on the upper side of the lower DBC substrate by means of steel screen printing, and the SiC MOSFET chips (1) are mounted on the surface of the nano silver solder paste (6).

Figure 5:
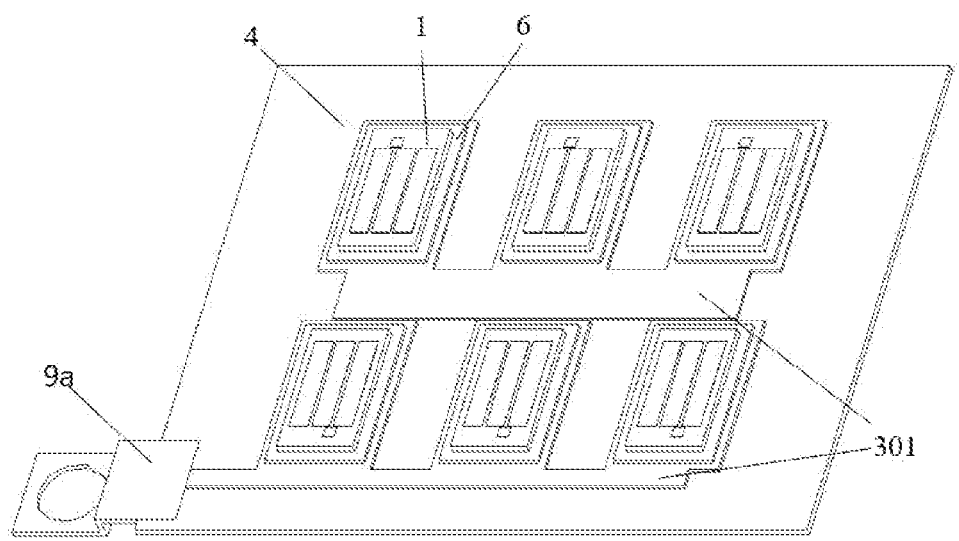
FIG. 5 is the schematic diagram of the packaging structure after step 4.

Step 4, as shown in FIG. 5, the positive terminal (9a) of the module is welded to the upper copper layer (301) of the lower DBC substrate.

Figure 6:
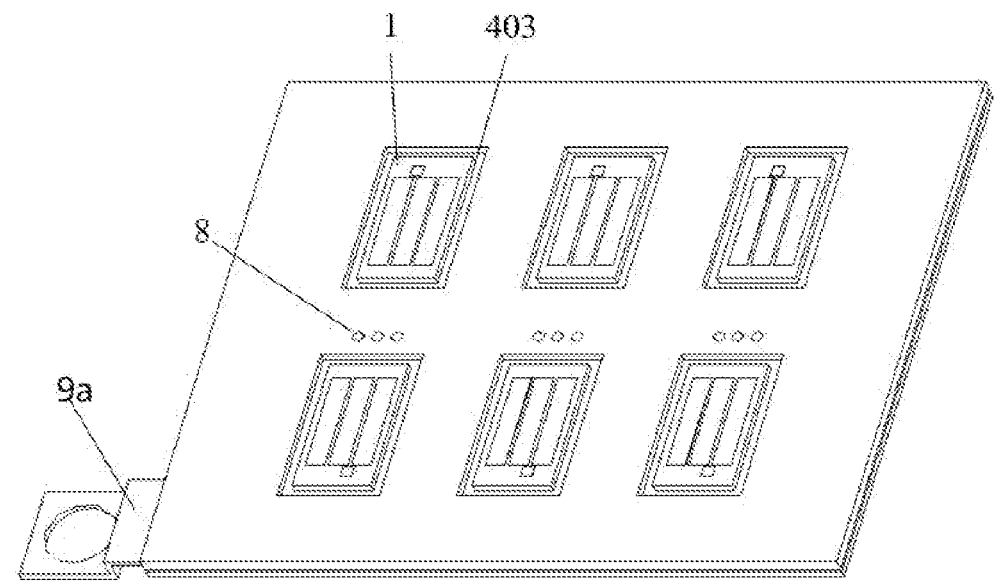
FIG. 6 is the schematic diagram of the packaging structure after step 5.

Step 5, as shown in FIG. 6, the said ceramic interposer (4) is bonded to the copper layer (301) on the upper side of the said lower DBC substrate (3), and each SiC MOSFET chip (1) is embedded in the corresponding rectangular frame (401) on the said ceramic interposer (4), and a gap (403) is kept between each chip and frame.

Figure 7:
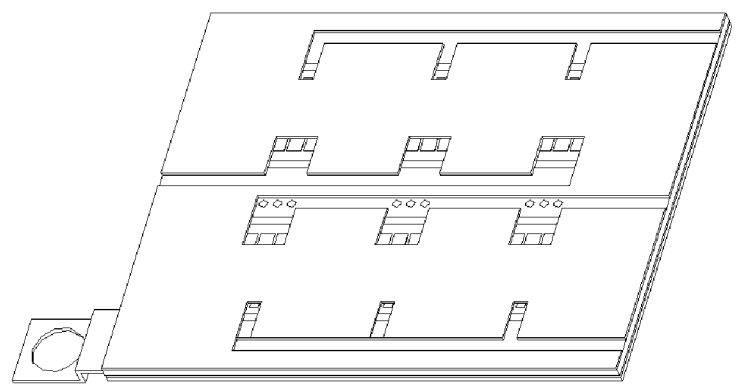
FIG. 7 is the schematic diagram of the packaging structure after step 6.

Step 6, as shown in FIG. 7, a silicon oxide dielectric layer (5) is made in the said gap (403) and the upper surfaces of the said ceramic interposer (4), and the SiC MOSFET chips (1).

Step 7, a redistribution layer (7) is made on the upper surface of the said ceramic interposer (4) and the said SiC MOSFET chips (1), and the said redistribution layer is embedded in the said silicon oxide dielectric layer (5).

Figure 8:
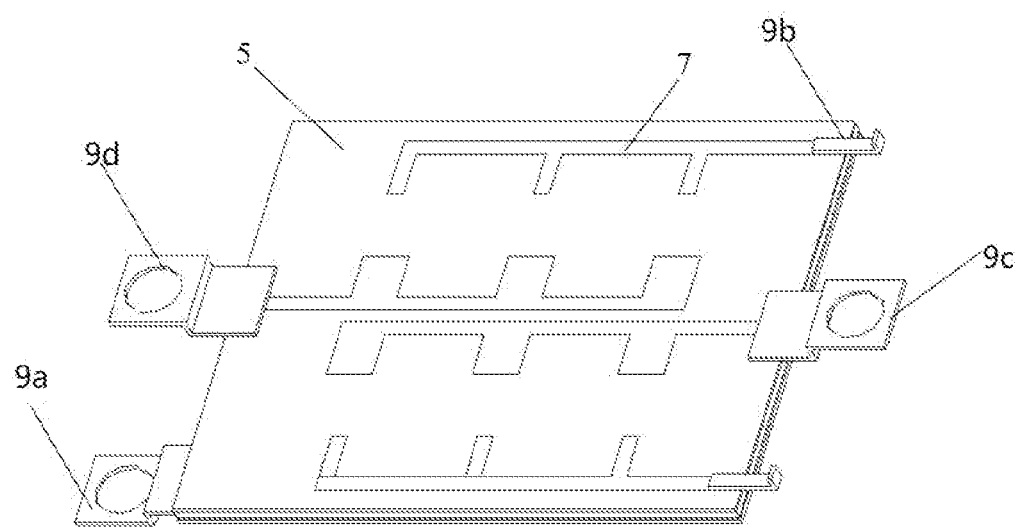
FIG. 8 is the schematic diagram of the packaging structure after step 8.

Step 8, a gate terminal (9b), a common terminal (9c) and a negative terminal (9d) of the module are welded to the upper surface of the said redistribution layer (7), as shown in FIG. 8.

Figure 9:
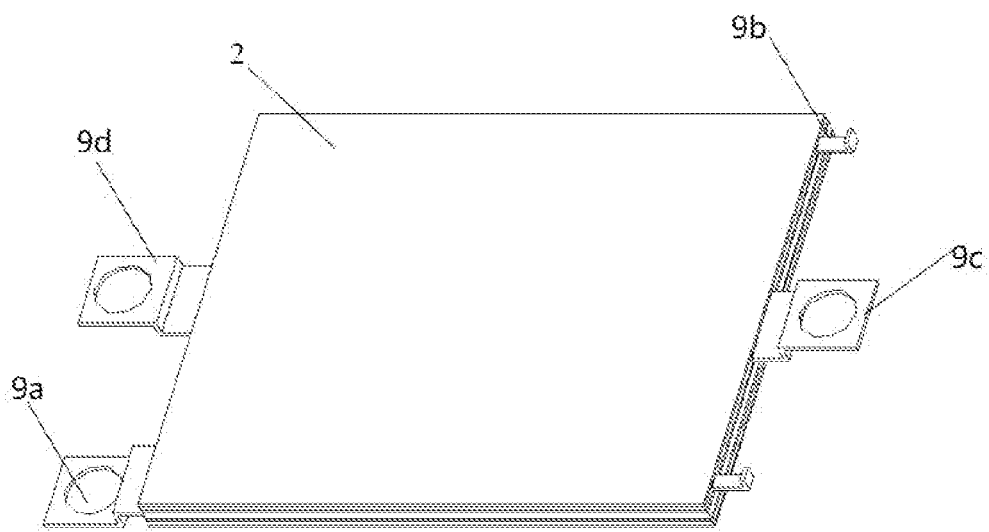
FIG. 9 is the schematic diagram of the packaging structure after step 9.

Step 9, the upper surface of the said redistribution layer (7) is connected to the lower copper layer (201) of the upper DBC substrate. The final structure is shown in FIG. 9.

Preferably, the packaging method of the said SiC MOSFET module is characterized in that a plurality of SiC MOSFET chips can be parallel connected (1) between the upper and lower DBC substrates on each bridge arm, and the upper and lower bridge arms are connected in series to realize the packaging of planar interconnection half bridge SiC power modules at different power levels.

The above embodiment describes in detail the preferred embodiment of the invention with reference to the appended drawings. Various formal modifications or changes to the above-mentioned embodiments made by those skilled in the art, without departing from the essence of the invention, will be in the scope of protection of the invention.

We claim:

1. A packaging structure of a SiC metal-oxide semiconductor field-effect transistor (MOSFET) module comprising:
    SiC MOSFET chips embedded with Schottky Barrier Diodes (SBD), an upper direct bonded copper (DBC) substrate, a lower DBC substrate, a ceramic interposer, a silicon oxide dielectric layer, nano silver paste, a redistribution layer, through-ceramic-hole conductive metal, a positive terminal, a negative terminal, a gate terminal and a common terminal;
    wherein a source electrode and a gate electrode are disposed on a front side of each of the SiC MOSFET chips, and a drain electrode is disposed on a back side of each of the SiC MOSFET chips; the drain electrode of each of the SiC MOSFET chips is connected to an upper copper layer of the lower DBC substrate using the nano silver paste, and the ceramic interposer is also connected to the upper copper layer of the lower DBC substrate, the upper copper layer of the lower DBC substrate is connected to the positive terminal of the SiC MOSFET module; the ceramic interposer is provided with rectangular frames and cylindrical holes, and the SiC MOSFET chips are embedded in the rectangular frames; a gap exists between the SiC MOSFET chips and the rectangular frames, respectively; the gap is filled with the silicon oxide dielectric layer, and the cylindrical via holes are filled with the through-ceramic-hole conductive metal; the redistribution layer and the silicon oxide dielectric layer are disposed on an upper surface of the SiC MOSFET chips and an upper surface of the ceramic interposer, the redistribution layer and the silicon oxide dielectric layer are connected to a lower copper layer of the upper DBC substrate, and the redistribution layer is connected to the gate electrode, the common terminal and the negative terminal of the SiC MOSFET module.

2. A manufacturing method of a SiC MOSFET module, comprising the following steps:

Step 1, a ceramic interposer is provided on which rectangular frames and cylindrical holes are made;

Step 2, conductive metal is filled into the cylindrical holes of the ceramic interposer;

Step 3, a lower DBC substrate is provided, and nano silver paste is printed on a copper layer on an upper side of the lower DBC substrate by means of steel screen printing, and SiC MOSFET chips are mounted on the nano silver paste;

Step 4, a positive terminal of the SiC MOSFET module is welded to the copper layer of the lower DBC substrate;

Step 5, the ceramic interposer is bonded to the copper layer on the upper side of the lower DBC substrate, and each of the SiC MOSFET chips is embedded in a corresponding rectangular frame on the ceramic adapter plate, and a gap is formed between each of the SiC MOSFET chips and corresponding rectangular frame;

Step 6, a silicon oxide dielectric layer is formed in the gap and on an upper surface of the SiC MOSFET chips and an upper surface of the ceramic interposer;

Step 7, a redistribution layer is formed on the upper surface of the ceramic interposer and the upper surface of the SiC MOSFET chips, and the redistribution layer is embedded in the silicon oxide dielectric layer;

Step 8, a gate terminal, a common terminal and a negative terminal of the SiC MOSFET module are welded on the upper surface of the redistribution layer.

3. The manufacturing method of a SiC MOSFET module according to claim 2, wherein a plurality of SiC MOSFET chips are parallel arranged between an upper DBC substrate and the lower DBC substrate on a bridge arm, and upper and lower bridge arms are connected in series to realize the packaging of planar interconnection half bridge SiC power modules at different power levels.

4. The packaging structure of claim 1, wherein the ceramic interposer is directly bonded to the upper copper layer of the lower DBC substrate.

* * * * *